United States Patent
Tsuda

(10) Patent No.: US 11,528,000 B2
(45) Date of Patent: Dec. 13, 2022

(54) RADIO FREQUENCY MODULE AND COMMUNICATION DEVICE

(71) Applicant: MURATA MANUFACTURING CO., LTD., Nagaokakyo (JP)

(72) Inventor: Motoji Tsuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 212 days.

(21) Appl. No.: 17/103,994

(22) Filed: Nov. 25, 2020

(65) Prior Publication Data

US 2021/0175861 A1 Jun. 10, 2021

(30) Foreign Application Priority Data

Dec. 10, 2019 (JP) .............................. JP2019-222860

(51) Int. Cl.
| | |
|---|---|
| H03G 3/30 | (2006.01) |
| H03F 3/195 | (2006.01) |
| H03F 3/24 | (2006.01) |
| H03F 3/60 | (2006.01) |

(52) U.S. Cl.
CPC ............. H03F 3/195 (2013.01); H03F 3/245 (2013.01); H03F 3/60 (2013.01); *H03F 2200/451* (2013.01)

(58) Field of Classification Search
CPC .................................... H03G 3/30; H03F 1/12
USPC ................................................... 330/278, 51
See application file for complete search history.

(56) References Cited

U.S. PATENT DOCUMENTS

| | | | |
|---|---|---|---|
| 2014/0162568 A1* | 6/2014 | Laskar | H04B 17/11 455/67.14 |
| 2018/0131501 A1* | 5/2018 | Little | H04B 1/0064 |
| 2019/0064235 A1* | 2/2019 | Miles | G01R 23/16 |
| 2019/0267339 A1* | 8/2019 | Murase | H01L 24/17 |
| 2020/0195280 A1* | 6/2020 | Burra | H04B 1/48 |
| 2021/0409062 A1* | 12/2021 | Matsumoto | H03F 1/0211 |

FOREIGN PATENT DOCUMENTS

| | | |
|---|---|---|
| JP | 2019-176452 A | 10/2019 |
| WO | 2018/168500 A1 | 9/2018 |

OTHER PUBLICATIONS

Korean Office Action dated Dec. 24, 2021 in Korean Application No. 10-2020-0157467.

* cited by examiner

*Primary Examiner* — Henry Choe
(74) *Attorney, Agent, or Firm* — Xsensus LLP

(57) ABSTRACT

A radio frequency module includes: a module board including a first principal surface and a second principal surface on opposite sides; a transmission input terminal; a transmission power amplifier that amplifies a transmission signal input from the transmission input terminal; a switch that switches between connecting and disconnecting the transmission input terminal and the transmission power amplifier, and a control circuit that controls the transmission power amplifier using digital control signals. The switch is disposed on the first principal surface, and the control circuit is disposed on the second principal surface.

20 Claims, 9 Drawing Sheets

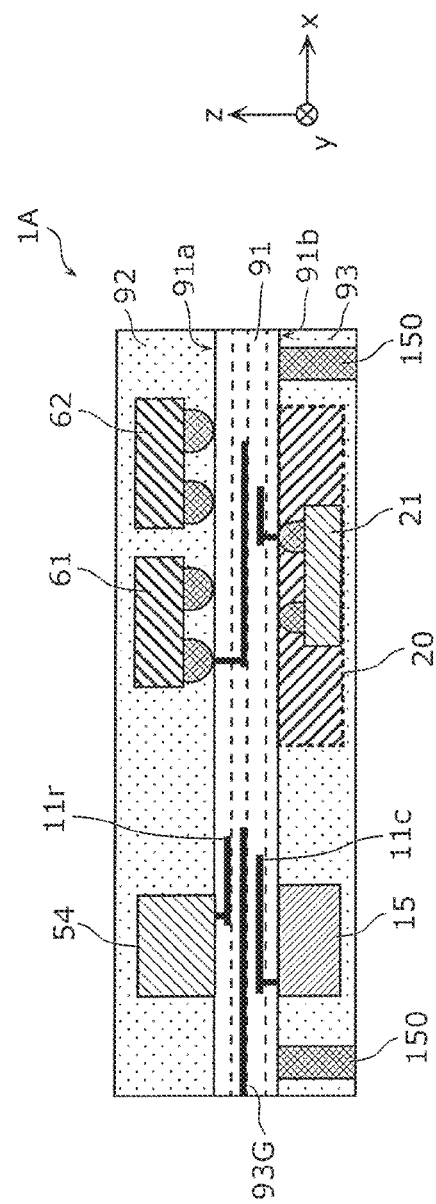

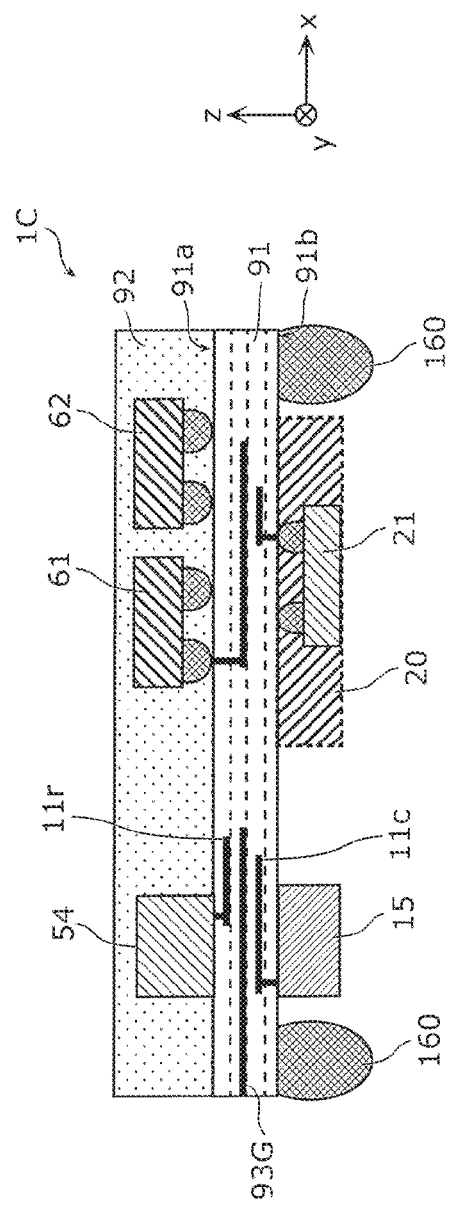

RADIO FREQUENCY MODULE AND COMMUNICATION DEVICE

CROSS REFERENCE TO RELATED APPLICATION

The present application is based on and claims priority to Japanese Patent Application No. 2019-222860 filed on Dec. 10, 2019. The entire disclosure of the above-identified application, including the specification, drawings and claims is incorporated herein by reference in its entirety.

TECHNICAL FIELD

The present disclosure relates to a radio frequency module and a communication device.

BACKGROUND

In mobile communication apparatuses such as a mobile phone the arrangement configuration of circuit elements included in radio frequency front-end circuits is becoming complex, particularly with developments in multiband technologies.

United States Patent Application Publication No. 2018/0131501 discloses a configuration of a front-end circuit including two transmission power amplifiers for executing transmission according to a plurality of communication bands (frequency bands). A switch is disposed on the input side of the two transmission power amplifiers. The switch switches, between the two transmission power amplifiers, the transmission power amplifier to which transmission signals from two transceiver circuits are to be input. Accordingly, two transmission signals output from the two transceiver circuits can be transmitted from two antennas with high isolation, via the front-end circuit.

SUMMARY

Technical Problems

However, as recognized by the present inventor, when the front-end circuit disclosed in United States Patent Application Publication No. 2018/0131501 is configured as a small front-end circuit using a single module, there is the issue that digital noise and/or power supply noise generated from a control circuit that controls the transmission power amplifiers flows into transmission paths on the input side of the transmission power amplifiers and causes the quality of radio frequency signals amplified by the transmission power amplifiers to deteriorate.

The present disclosure provides a radio frequency module and a communication device that suppress deterioration of quality of radio frequency transmission signals amplified by a transmission power amplifier.

Solutions

A radio frequency module according to an aspect of the present invention includes a module board including a first principal surface and a second principal surface on opposite sides of the module board, a transmission input terminal, a transmission power amplifier configured to amplify a transmission signal input from the transmission input terminal, a switch disposed on the first principal surface and configured to switch between connecting and disconnecting the transmission input terminal and the transmission power amplifier, and a control circuit disposed on the second principal surface and configured to control the transmission power amplifier using a digital control signal.

Advantageous Effects

The present disclosure can provide a radio frequency module and a communication device that suppress deterioration of quality of radio frequency transmission signals amplified by a transmission power amplifier.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2B is a schematic diagram illustrating a cross-sectional configuration of the radio frequency module according to Working Example 1.

FIG. 2C is a schematic diagram illustrating a cross-sectional configuration of a radio frequency module according to Working Example 2.

DESCRIPTION OF EMBODIMENTS

Figure 1A:
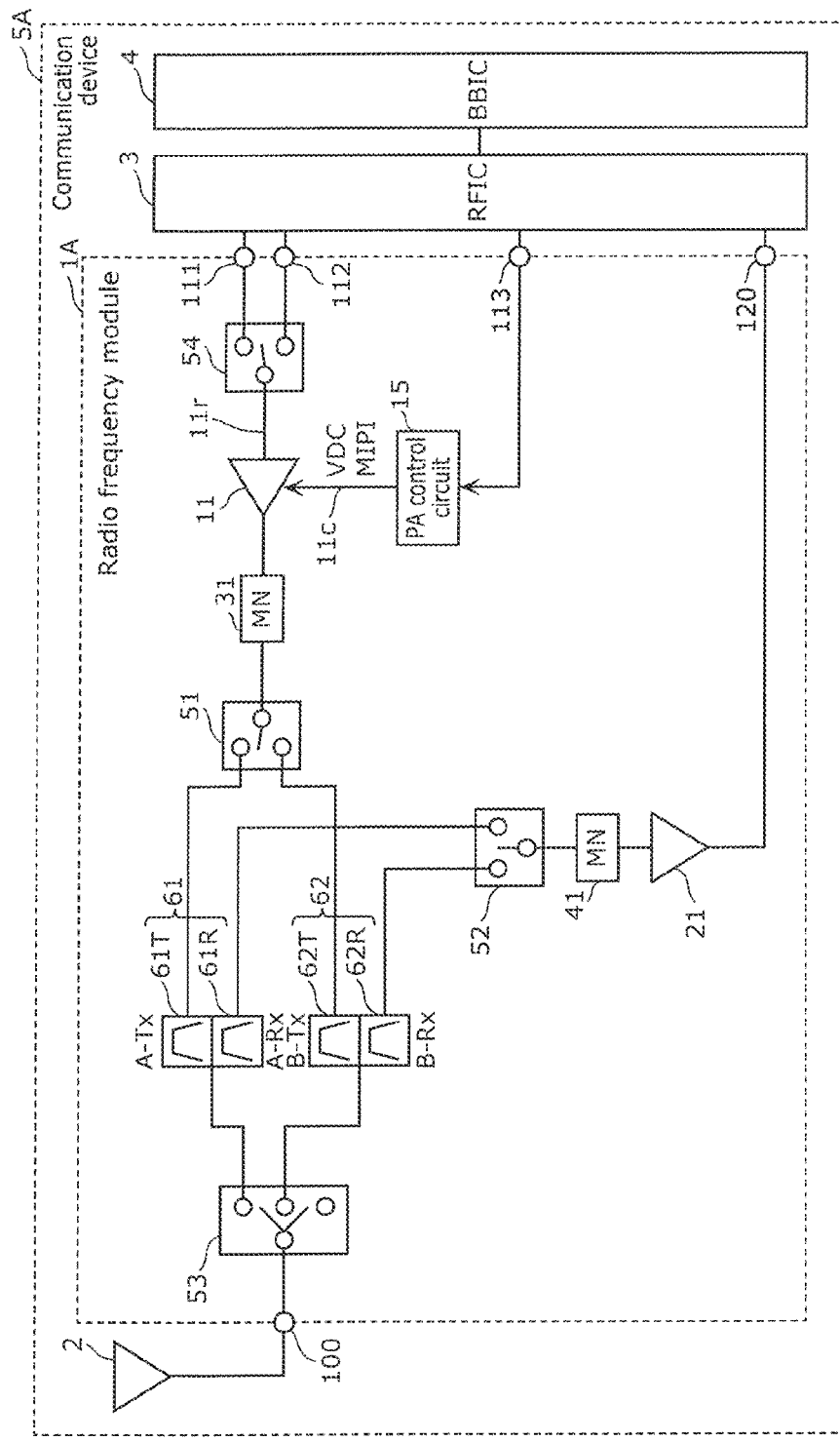
FIG. 1A is a circuit configuration diagram of a radio frequency module and a communication device according to an embodiment.

Hereinafter, exemplary embodiments of the present disclosure will be described in detail with reference to the drawings. It should be noted that the subsequently described exemplary embodiment shows a generic or a specific example. The numerical values, shapes, materials, elements, the arrangement and connection of the elements, and others, indicated in the following exemplary embodiment are mere examples, and therefore are not intended to limit the present disclosure. Among the elements described in the following exemplary embodiment and variation, elements not recited in any one of the independent claims are described as optional elements. In addition, the sizes of the elements and the ratio of the sizes illustrated in the drawings are not necessarily accurate. In the figures, elements which are substantially the same are given the same reference signs, and overlapping description is omitted or simplified.

Furthermore, hereinafter, terms indicating a relationship between elements such as "parallel" and "perpendicular", terms indicating the shape of an element such as rectangular, as well as numerical ranges are not only expressions with strict meanings, but also expressions whose meanings include substantially the same range, such as an error of several percent, for example.

Furthermore, with regard to A, B, and C which are mounted on a board in the subsequent description, "C is mounted between A and B in a plan view of the board (or a principal surface of the board)" means that, in a plan view of the board, a straight line connecting an arbitrary point in A and an arbitrary point in B passes through the region of C. Furthermore, a plan view of the board means viewing the board and circuit elements mounted on the board by orthographic projection of a plane parallel to the board.

Furthermore, in the subsequent description, "transmission path" refers to the transfer path formed by a line for propagating a radio frequency transmission signal, an electrode directly connected to the line, a terminal directly connected to the line or the electrode, and so on. In addition, in the subsequent description, "reception path" refers to the transfer path formed by a line for propagating a radio frequency reception signal, an electrode directly connected to the line, a terminal directly connected to the line or the electrode, and so on.

Moreover, in the subsequent description, "A and B are connected" applies, not only to a case in which A and B are physically connected, but also to a case where A and B are electrically connected.

Embodiment

[1. Circuit Configuration of Radio Frequency Module 1A and Communication Device 5A]

FIG. 1A is a circuit configuration diagram of radio frequency module 1A and communication device 5A according to an embodiment. As illustrated in the figure, communication device 5A includes radio frequency module 1A, antenna 2, RF signal processing circuit (RFIC) 3, and baseband signal processing circuit (BBIC) 4.

RFIC 3 is an RF signal processing circuit that processes a radio frequency signal that is to be transmitted or has been received by antenna 2. Specifically, RFIC 3 performs, by downconversion, and so on, signal processing on a reception signal input via a reception path of radio frequency module 1A, and outputs the reception signal generated by the signal processing to BBIC 4. Furthermore, RFIC 3 outputs a radio frequency transmission signal processed based on a signal input from BBIC 4, to a transmission path of radio frequency module 1A.

BBIC 4 is a circuit that performs data processing using a signal having a lower frequency than a radio frequency signals transferred in radio frequency module 1A. The signal processed by BBIC 4 is, for example, used as an image signal for image display or as a sound signal for communication via a speaker.

Furthermore, RFIC 3 also functions as a controller that controls the connection of switches 51, 52, 53, and 54 included in radio frequency module 1A, based on the communication band (frequency band) to be used. Specifically, RFIC 3 switches the connections of switches 51 to 54 included in radio frequency module 1A according to a control signal (not illustrated). It should be noted that the controller may be provided outside RFIC 3, and may be provided in radio frequency module 1A or BBIC 4, for example.

Furthermore, RFIC 3 also functions as a controller that controls the gain of transmission power amplifier 11 included in radio frequency module 1A. Specifically, RFIC 3 outputs a digital control signal such as MIPI to radio frequency module 1A via control signal terminal 113. Furthermore, RFIC 3 outputs, to radio frequency module 1A via control signal terminal 113, direct current voltage signals VDC for power supply voltage Vcc and bias voltage Vbias which are to be supplied to transmission power amplifier 11. PA control circuit 15 of radio frequency module 1A adjusts the gain of transmission power amplifier 11 according to the digital control signal and the direct current voltage signal input via control signal terminal 113. It should be noted that direct current voltage signal VDC may be input from a terminal different from control signal terminal 113. It should be noted that the controller may be provided outside RFIC 3, and may be provided in BBIC 4, for example.

Antenna 2 is connected to antenna connection terminal 100 of radio frequency module 1A, emits radio frequency signals output from radio frequency module 1A, and receives radio frequency signals from the outside and outputs the received radio frequency signals to radio frequency module 1A.

It should be noted that in communication device 5A according to this embodiment, antenna 2 and BBIC 4 are not essential elements.

Next, the detailed configuration of radio frequency module 1A will be described.

As illustrated in FIG. 1A, radio frequency module 1A includes antenna connection terminal 100, transmission input terminals 111 and 112, reception output terminal 120, transmission power amplifier 11, control signal terminal 113, PA control circuit 15, reception low-noise amplifier 21, transmission filters 61T and 62T, reception filters 61R and 62R, matching terminals 31 and 41, and switches 51, 52, 53, and 54.

Antenna connection terminal 100 is an antenna common terminal connected to antenna 2.

Transmission power amplifier 11 is an amplifier that amplifies transmission signals of communication band A (first communication band) and communication band B (second communication band) input from transmission input terminals 111 and 112. Transmission power amplifier 11 includes an input terminal connected to switch 54 and an output terminal connected to matching circuit 31.

PA control circuit 15 is an example of a control circuit that controls transmission power amplifier 11 using digital control signals, and adjusts the gain of transmission power amplifier 11 according to digital control signal MIPI and direct current voltage signal VDC input via control signal terminal 113. PA control circuit 15 may be formed in a first semiconductor integrated circuit (IC). The first semiconductor IC is configured using, for example, a complementary metal oxide semiconductor (CMOS). Specifically, the first semiconductor IC is formed using a silicon on insulator (SOI) process. Accordingly, the first semiconductor IC can be manufactured at low cost.

It should be noted that the first semiconductor IC may be formed using at least one of GaAs, SiGe, or GaN. Accordingly, radio frequency signals having high quality amplification performance and noise performance can be output.

Reception low-noise amplifier 21 is an amplifier that amplifies radio frequency signals of communication band A and communication band B with low noise, and outputs the amplified radio frequency signals to reception output terminal 120.

Transmission filter 61T is disposed in a transmission path connecting transmission power amplifier 11 and antenna connection terminal 100, and passes transmission signals of the transmission band of communication band A out of the transmission signals amplified by transmission power amplifier 11. Furthermore, transmission filter 62T is disposed in a transmission path connecting transmission power amplifier 11 and antenna connection terminal 100, and passes transmission signals of the transmission band of communication band B out of the transmission signals amplified by transmission power amplifier 11.

Reception filter 61R is disposed in a reception path connecting reception low-noise amplifier 21 and antenna connection terminal 100, and passes reception signals of the reception band of communication band A out of the reception signals input from antenna connection terminal 100. Furthermore, reception filter 62R is disposed in a reception path connecting reception low-noise amplifier 21 and antenna connection terminal 100, and passes reception signals of the reception band of communication band B out of the reception signals input from antenna connection terminal 100.

Transmission filter 61T and reception filter 61R constitute duplexer 61 which has, as a passband, communication band A. Furthermore, transmission filter 62T and reception filter 62R constitute duplexer 62 which has, as a passband, communication band B.

Matching circuit 31 is disposed in a transmission path connecting transmission power amplifier 11 and transmission filters 61T and 62T, and matches impedances of transmission power amplifier 11 and transmission filters 61T and 62T.

Matching circuit 41 is disposed in a reception path connecting reception low-noise amplifier 21 and reception filters 61R and 62R, and matches impedances of reception low-noise amplifier 21 and reception filters 61R and 62R.

Switch 54 includes a common terminal and two selection terminals. The common terminal of switch 54 is connected to the input terminal of transmission power amplifier 11. One of the selection terminals of switch 54 is connected to transmission input terminal 111, and the other selection terminal of switch 54 is connected to transmission input terminal 112. In this connection configuration, switch 54 switches between connecting the common terminal and the one selection terminal and connecting the common terminal and the other selection terminal. In other words, switch 54 switches connection and disconnection between transmission input terminals 111 and 112 and transmission power amplifier 11. Switch 54 is, for example, a single pole, double throw (SPDT) switch circuit.

It should be noted that, for example, transmission signals of communication band A are input from transmission input terminal 111 and transmission signals of communication band B are input from transmission input terminal 112.

Furthermore, transmission signals of communication band A or B of a fourth generation mobile communication system (4G), for example, are input from transmission input terminal 111, and transmission signals of communication band A or B of a fifth generation mobile communication system (5G), for example, are input from transmission input terminal 112.

Switch 51 includes a common terminal and two selection terminals. The common terminal of switch 51 is connected to the output terminal of transmission power amplifier 11 via matching circuit 31. One selection terminal of switch 51 is connected to transmission filter 61T, and the other selection terminal of switch 51 is connected to transmission filter 62T. In this connection configuration, switch 51 switches between connecting the common terminal and the one selection terminal and connecting the common terminal and the other selection terminal. In other words, switch 51 switches between connecting the transmission path for transferring transmission signals of communication band A and transmission power amplifier 11, and connecting the transmission path for transferring transmission signals of communication band B and transmission power amplifier 11. Switch 51 is, for example, an SPDT switch circuit.

Switch 52 includes a common terminal and two selection terminals. The common terminal of switch 52 is connected to the input terminal of reception low-noise amplifier 21 via matching circuit 41. One selection terminal of switch 52 is connected to reception filter 61R, and the other selection terminal of switch 52 is connected to reception filter 62R. In this connection configuration, switch 52 switches between connecting the common terminal and the one selection terminal and connecting the common terminal and the other selection terminal. In other words, switch 52 switches between connecting reception low-noise amplifier 21 and the reception path for transferring reception signals of communication band A, and connecting reception low-noise amplifier 21 and the reception path for transferring reception signals of communication band B. Switch 52 is, for example, an SPDT switch circuit.

Switch 53 is an example of an antenna switch and is connected to antenna connection terminal 100. Switch 53 switches between (1) connecting antenna terminal 100 and the signal path for transferring transmission signals and reception signals of communication band A and (2) connecting antenna terminal 100 and the signal path for transferring transmission signals and reception signals of communication band B. It should be noted that switch 53 may be a multiple-connection switch circuit capable of simultaneously performing (1) and (2) above.

Moreover, a multiplexer may be disposed between switch 53 and antenna connection terminal 100. Furthermore, a matching circuit may be disposed between switch 53 and duplexer 61 and between switch 53 and duplexer 62.

It should be noted that transmission filters 61T and 62T and reception filters 61R and 62R may be any of acoustic wave filters that make use of surface acoustic waves (SAW), acoustic wave filters that make use of bulk acoustic waves (BAW), LC resonant filters, and dielectric filters, for example, but are not limited to these filters.

Furthermore, transmission power amplifier 11 and reception low-noise amplifier 21 are each configured using, for example, a field effect transistor (FET) or a heterojunction bipolar transistor (HBT) made of, for instance, a Si-based complementary metal oxide semiconductor (CMOS) or GaAs.

Furthermore, reception low-noise amplifier 21 and switches 52 and 53 may be formed in a single semiconductor integrated circuit (IC). In addition, the aforementioned semiconductor IC may further include transmission power amplifier 11 and switches 51 and 54. The semiconductor IC is configured of a CMOS, for example. Specifically, the semiconductor IC is formed using a silicon on insulator (SOI) process. Accordingly, the semiconductor IC can be manufactured at low cost. It should be noted that the semiconductor IC may include at least one of GaAs, SiGe, or GaN. Accordingly, radio frequency signals having high quality amplification performance and noise performance can be output.

In the configuration of radio frequency module 1A described above, switch 54, transmission power amplifier 11, matching circuit 31, switch 51, transmission filter 61T, and switch 53 form a first transmission circuit that transfers transmission signals of communication band A toward antenna connection terminal 100. Furthermore, switch 53, reception filter 61R, switch 52, matching circuit 41, and reception low-noise amplifier 21 form a first reception circuit that transfers reception signals of communication band A from antenna 2 via antenna connection terminal 100.

In addition, switch 54, transmission power amplifier 11, matching circuit 31, switch 51, transmission filter 62T, and switch 53 form a second transmission circuit that transfers transmission signals of communication band B toward antenna connection terminal 100. Furthermore, switch 53, reception filter 62R, switch 52, matching circuit 41, and reception low-noise amplifier 21 form a second reception circuit that transfers reception signals of communication band B from antenna 2 via antenna connection terminal 100.

According to the above-described configuration, radio frequency module 1A can independently execute transmission, reception, or transmission and reception of either radio frequency signals of communication band A or radio frequency signals of communication band B. In addition, radio frequency module 1A can also execute at least one of simultaneous transmission, simultaneous reception, or simultaneous transmission and reception of radio frequency signals of communication band A and radio frequency signals of communication band B.

It should be noted that, in the radio frequency module according to the present disclosure, the above-described two transmission circuits and the above-described two reception circuits need not be connected to antenna connection terminal 100 via switch 53, and the two transmission circuits and the two reception circuits may be connected to antenna 2 via a different terminal. Furthermore, it is sufficient that the radio frequency module according to the present disclosure includes at least the first transmission circuit.

Furthermore, in the radio frequency module according to the present disclosure, it is sufficient that the first transmission circuit includes transmission power amplifier 11, PA control circuit 15, and switch 54.

[2. Circuit Configuration of Radio Frequency Module 1B and Communication Device 5B According to a Variation]

Figure 1B:
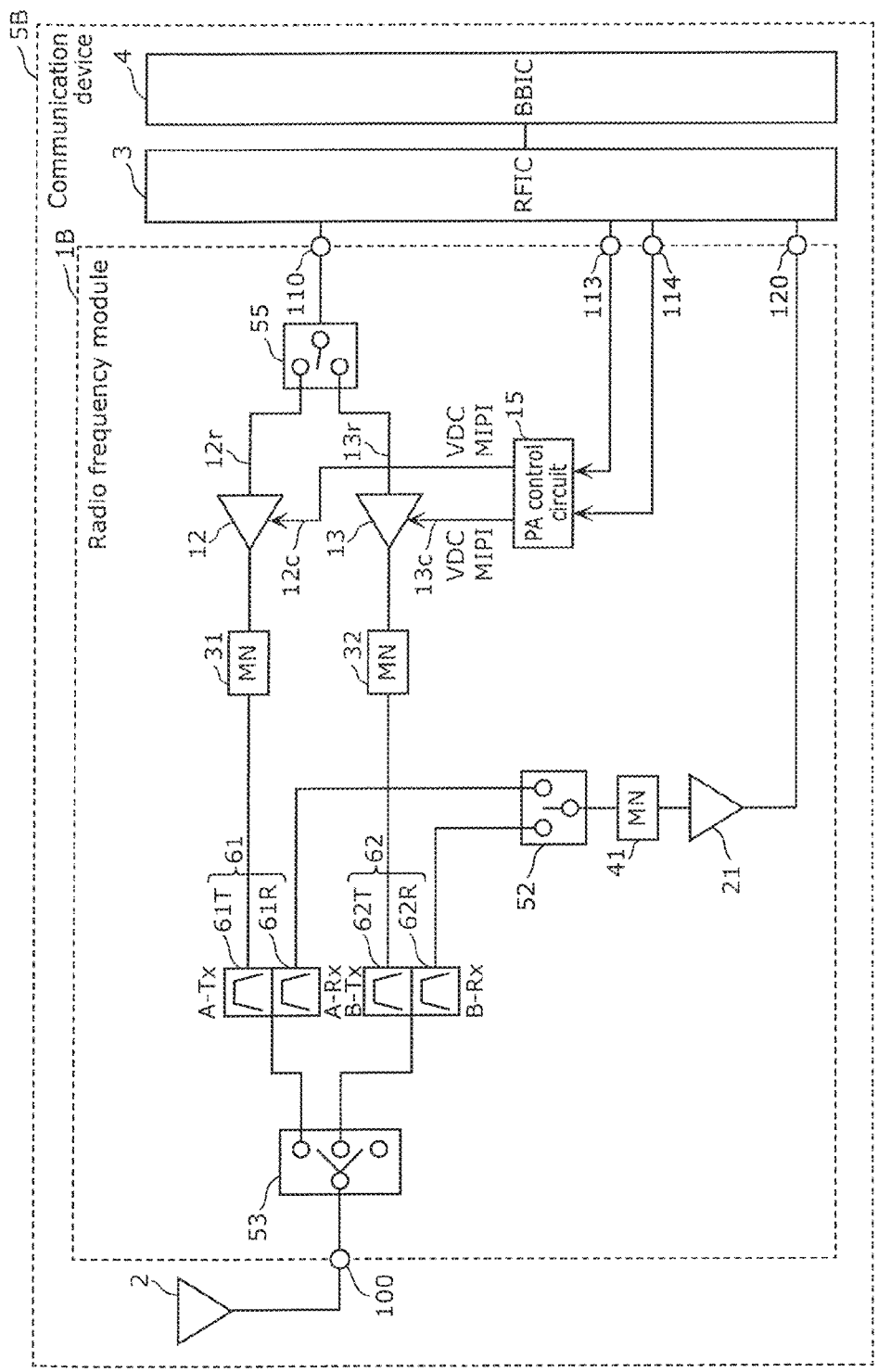
FIG. 1B is a circuit configuration diagram of a radio frequency module and a communication device according to a variation of the embodiment.

FIG. 1B is a circuit configuration diagram of radio frequency module 1B and communication device 5B according to a variation of this embodiment. As illustrated in the figure, communication device 5B includes radio frequency module 1B, antenna 2, RFIC 3, and BBIC 4. Compared to communication device 5A according to this embodiment, communication device 5B according to this variation is different only in the configuration of radio frequency module 1B. Hereinafter, description of antenna 2, RFIC 3, and BBIC 4 will be omitted, and the configuration of radio frequency module 1B will be described.

As illustrated in FIG. 1B, radio frequency module 1B includes antenna connection terminal 100, transmission input terminal 110, reception output terminal 120, control signal terminals 113 and 114, transmission power amplifiers 12 and 13, PA control circuit 15, reception low-noise amplifier 21, transmission filters 61T and 62T, reception filters 61R and 62R, matching circuits 31, 32, and 41, and switches 52, 53, and 55. Compared to radio frequency module 1A according to this embodiment, radio frequency module 1B according to this variation is different in the configuration of the transmission circuits. Hereinafter, radio frequency module 1B according to this variation will be described, omitting description of points that are the same as in radio frequency module 1A according to this embodiment and focusing on the points that are different.

Transmission power amplifier 12 is an amplifier that amplifies transmission signals of communication band A (first communication band) input from transmission input terminal 110. Transmission power amplifier 12 includes an input terminal connected to switch 55 and an output terminal connected to matching circuit 31.

Transmission power amplifier 13 is an amplifier that amplifies transmission signals of communication band B (second communication band) input from transmission input terminal 110. Transmission power amplifier 13 includes an input terminal connected to switch 55 and an output terminal connected to matching circuit 32.

PA control circuit 15 is an example of a control circuit that controls transmission power amplifier 12 using digital control signals, and adjusts the gain of transmission power amplifier 12 according to digital control signal MIPI and direct current voltage signal VDC input via control signal terminal 113. PA control circuit 15 is an example of a control circuit that controls transmission power amplifier 13 using digital control signals, and adjusts the gain of transmission power amplifier 13 according to digital control signal MIPI and direct current voltage signal VDC input via control signal terminal 114.

PA control circuit 15 may be formed in a semiconductor IC. The semiconductor IC is configured of a CMOS, for example. Specifically, the semiconductor IC is formed using a SOI process. Accordingly, the semiconductor IC can be manufactured at low cost. It should be noted that the semiconductor IC may include at least one of GaAs, SiGe, or GaN. Accordingly, radio frequency signals having high quality amplification performance and noise performance can be output.

Transmission filter 61T is disposed in a transmission path connecting transmission power amplifier 12 and antenna connection terminal 100, and passes transmission signals of the transmission band of communication band A amplified by transmission power amplifier 12. Transmission filter 62T is disposed in a transmission path connecting transmission power amplifier 13 and antenna connection terminal 100, and passes transmission signals of the transmission band of communication band B amplified by transmission power amplifier 13.

Matching circuit 31 is disposed in the transmission path connecting transmission power amplifier 12 and transmission filters 61T, and matches impedances of transmission power amplifier 12 and transmission filters 61T. Matching circuit 32 is disposed in the transmission path connecting transmission power amplifier 13 and transmission filters 62T, and matches impedances of transmission power amplifier 13 and transmission filters 62T.

Switch 55 includes a common terminal and two selection terminals. The common terminal of switch 55 is connected to transmission input terminal 110. One selection terminal of switch 55 is connected to the input terminal of transmission power amplifier 12. The other selection terminal of switch 55 is connected to the input terminal of transmission power amplifier 13. In this connection configuration, switch 55 switches between connecting the common terminal and the one selection terminal and connecting the common terminal and the other selection terminal. In other words, switch 55 switches connection and disconnection between transmission input terminal 110 and transmission power amplifiers 12 and 13. Switch 55 is, for example, an SPDT switch circuit.

It should be noted that transmission signals of communication band A and communication band B, for example, are input from transmission input terminal 110.

Furthermore, transmission signals of communication band A of 4G and transmission signals of communication band B of 5G may be input from transmission input terminal 110.

It should be noted that switch 55 may be configured of a double pole, double throw (DPDT) switch circuit which includes two common terminals and two selection terminals. In this case, radio frequency module 1B includes two transmission input terminals 111 and 112, with transmission input terminal 111 being connected to one of the common terminals of switch 55 and transmission input terminal 112 being connected to the other common terminal of switch 55. In this connection configuration, switch 55 switches between connecting the one common terminal and one selection terminal and connecting the one common terminal and the other selection terminal, and switches between connecting the other common terminal and the one selection terminal and connecting the other common terminal and the other selection terminal. In other words, switch 55 switches connection and disconnection between transmission input terminals 111 and 112 and transmission power amplifiers 12 and 13. In this case, for example, transmission signals of communication band A are input from transmission input terminal 111, and transmission signals of communication band B are input from transmission input terminal 112.

Furthermore, for example, transmission signals of communication band A and communication band B of 4G may be input from transmission input terminal 111, and transmission signals of communication band A and communication band B of 5G may be input from transmission input terminal 112.

Furthermore, transmission power amplifiers 12 and 13, and reception low-noise amplifier 21 are each configured of, for example, a FET or HBT made of, for instance, a Si-based CMOS or GaAs.

In the configuration of radio frequency module 1B described above, switch 55, transmission power amplifier 12, matching circuit 31, transmission filter 61T, and switch 53 form a first transmission circuit that transfers transmission signals of communication band A toward antenna connection terminal 100. Furthermore, switch 53, reception filter 61R, switch 52, matching circuit 41, and reception low-noise amplifier 21 form a first reception circuit that transfers reception signals of communication band A from antenna 2 via antenna connection terminal 100.

In addition, switch 55, transmission power amplifier 13, matching circuit 32, transmission filter 62T, and switch 53 form a second transmission circuit that transfers transmission signals of communication band B toward antenna connection terminal 100.

Furthermore, switch 53, reception filter 62R, switch 52, matching circuit 41, and reception low-noise amplifier 21 form a second reception circuit that transfers reception signals of communication band B from antenna 2 via antenna connection terminal 100.

According to the above-described circuit configuration, radio frequency module 1B can independently execute transmission, reception, or transmission and reception of either radio frequency signals of communication band A or radio frequency signals of communication band B. In addition, radio frequency module 1B can also execute at least one of simultaneous transmission, simultaneous reception, or simultaneous transmission and reception of radio frequency signals of communication band A and radio frequency signals of communication band B.

[3. Miniaturization of Radio Frequency Modules 1A and 1B]

Here, when the respective circuit elements included in radio frequency module 1A or 1B are to be mounted on a single module board as a small front-end circuit, it is necessary to reduce the circuit component layout area of the module board surface. In this case, in radio frequency module 1A, there arises the problem that the digital control signals and power supply signals output from PA control circuit 15 and transferred through control signal path 11c flow into radio frequency transmission path 11r on the input side of transmission power amplifier 11 as digital noise and/or power supply noise, thereby causing the quality of the radio frequency transmission signals amplified by transmission power amplifier 11 to deteriorate. Furthermore, in radio frequency module 1B, there arises the problem that the digital control signals and power supply signals output from PA control circuit 15 and transferred through control signal path 12c flow into radio frequency transmission path 12r on the input side of transmission power amplifier 12 as digital noise and/or power supply noise, thereby causing the quality of the radio frequency transmission signals amplified by transmission power amplifier 12 to deteriorate. Furthermore, in radio frequency module 1B, there arises the problem that the digital control signals and power supply signals output from PA control circuit 15 and transferred through control signal path 13c flow into radio frequency transmission path 13r on the input side of transmission power amplifier 13 as digital noise and/or power supply noise, thereby causing the quality of the radio frequency transmission signals amplified by transmission power amplifier 13 to deteriorate.

In response to the above problems, radio frequency modules 1A and 1B have configurations that prevent digital control signals and/or power supply signals transferred through the control signal paths from flowing into the radio frequency transmission paths as digital noise and/or power supply noise. Hereinafter, a configuration that improves isolation between the control signal path and the radio frequency transmission path in each of radio frequency module 1A according to this embodiment and radio frequency module 1B according to this variation will be described.

[4. Circuit Element Arrangement Configuration of Radio Frequency Module 1A According to Working Example 1]

Figure 2A:
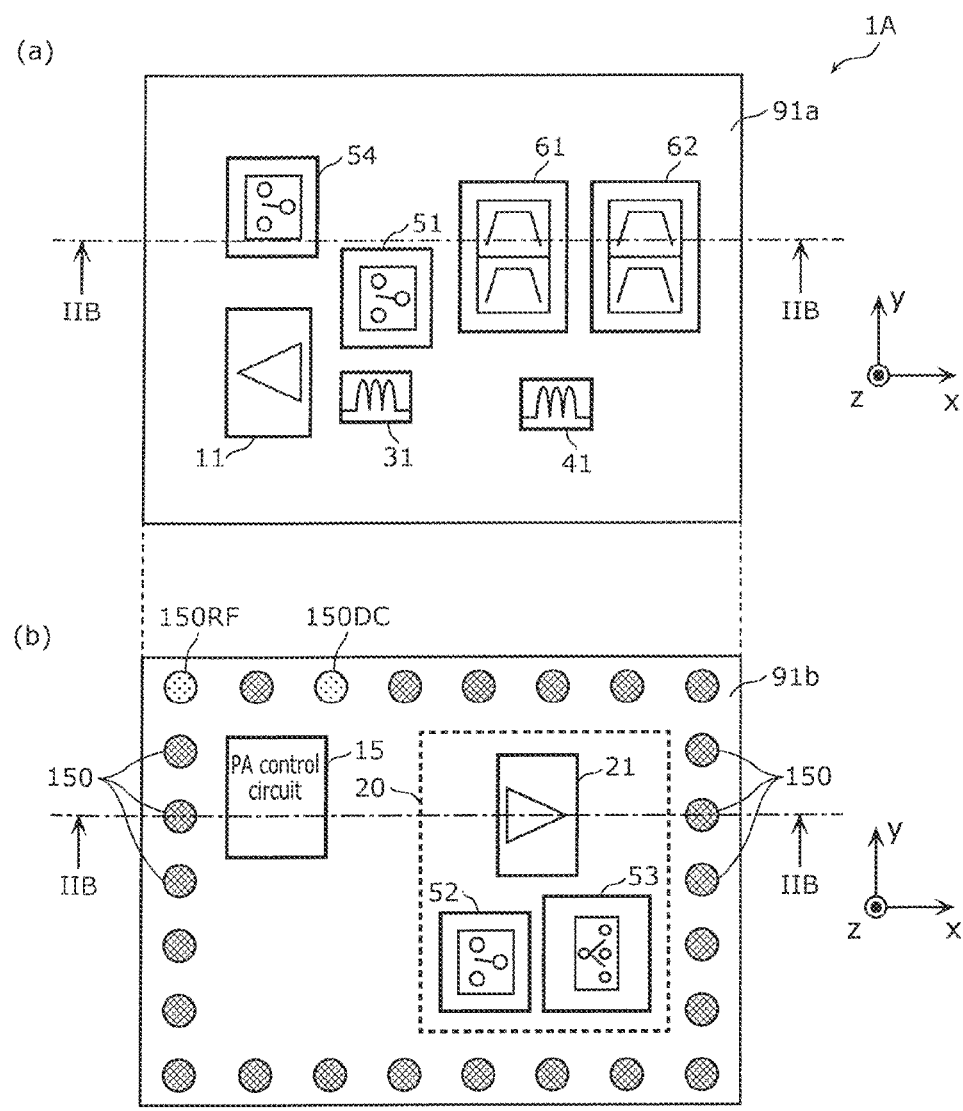
FIG. 2A is a schematic diagram illustrating a plan view configuration of a radio frequency module according to Working Example 1.

FIG. 2A is a schematic diagram illustrating a plan view configuration of radio frequency module 1A according to Working Example 1. Furthermore, FIG. 2B is a schematic diagram illustrating a cross-sectional configuration of radio frequency module 1A according to Working Example 1, and specifically illustrates a cross-section taken along line IIB-IIB in FIG. 2A. It should be noted that (a) in FIG. 2A illustrates an arrangement diagram of circuit elements in the case where principal surface 91a of opposite principal surfaces 91a and 91b of module board 91 is viewed from the z-axis positive direction-side. On the other hand, (b) in FIG. 2A illustrates a see-through view of the arrangement of circuit elements in the case where principal surface 91b is viewed from the z-axis positive direction-side.

Radio frequency module 1A according to this working example shows a specific arrangement configuration of respective circuit elements included in radio frequency module 1A according to the embodiment illustrated in FIG. 1A.

As illustrated in FIG. 2A and FIG. 2B, radio frequency module 1A according to this working example further includes module board 91, resin materials 92 and 93, and external connection terminals 150, in addition to the circuit configuration illustrated in FIG. 1A.

Module board 91 includes principal surface 91a (first principal surface) and principal surface 91b (second principal surface) on opposite sides, and is a board on which the transmission circuits and the reception circuits are mounted. For module board 91, for example, a low temperature co-fired ceramic (LTCC) board having a stacked structure of a plurality of dielectric layers, a high temperature co-fired ceramic (HTCC) board, a component-embedded board, a board having a redistribution layer (RDL), a printed circuit board, or the like can be used.

Resin material 92 is disposed on principal surface 91a of module board 91, covers a portion of the transmission circuits, a portion of the reception circuits, and principal surface 91a of module board 91, and has a function of ensuring reliability such as the mechanical strength and moisture resistance of the circuit elements included in the transmission circuits and reception circuits. Resin material 93 is disposed on principal surface 91b of module board 91, covers a portion of the transmission circuits, a portion of the reception circuits, and principal surface 91b of module board 91, and has a function of ensuring reliability such as the mechanical strength and moisture resistance of the circuit elements included in the transmission circuits and reception circuits. It should be noted that resin materials 92 and 93 are not essential elements of the radio frequency module according to the present disclosure.

As illustrated in FIG. 2A and FIG. 2B, in radio frequency module 1A according to this working example, transmission power amplifier 11, switches 51 and 54, duplexers 61 and 62, and matching circuits 31 and 41 are surface mounted on principal surface 91a of module board 91. On the other hand, PA control circuit 15, reception low-noise amplifier 21, and switches 52 and 53 are surface mounted on principal surface 91b of module board 91.

In this working example, switch 54 is mounted on principal surface 91a (first principal surface). On the other hand, PA control circuit 15 is mounted on principal surface 91b (second principal surface). In other words, PA control circuit 15 and switch 54 are disposed with module board 91 interposed therebetween. Accordingly, as illustrated in FIG. 2B, radio frequency transmission path 11r connecting transmission power amplifier 11 and switch 54 and control signal path 11c connecting transmission power amplifier 11 and PA control circuit 15 can be formed distributed between the principal surface 91a-side of module board 91 and principal surface 91b-side of module board 91, respectively. Accordingly, since isolation between control signal path 11c and radio frequency transmission path 11r can be ensured, it is possible to prevent digital control signals and/or power supply signals output from PA control circuit 15 and transferred through control signal path 11c from flowing into radio frequency transmission path 11r on the input side of transmission power amplifier 11 as digital noise and/or power supply noise. Therefore, it is possible to suppress deterioration of quality of radio frequency transmission signals amplified by transmission power amplifier 11.

It should be noted that, as illustrated in FIG. 2B, it is desirable that module board 91 include ground planar electrode 93G formed between principal surface 91a and principal surface 91b. More specifically, it is desirable that module board 91 have a multilayer structure in which a plurality of dielectric layers are stacked, and that ground planar electrode 93G be formed in at least one of the dielectric layers. Here, it is desirable that, in a plan view of module board 91, a footprint of ground planar electrode 93G at least partially overlaps a footprint of switch 54, and a footprint of ground planar electrode 93G at least partially overlaps a footprint of PA control circuit 15.

Accordingly, the isolation between control signal path 11c and radio frequency transmission path 11r is further improved by the electromagnetic field blocking function of ground planar electrode 93G. Therefore, it is possible to further suppress deterioration of quality of radio frequency transmission signals amplified by transmission power amplifier 11.

In addition, it is desirable that, in a plan view of module board 91, a footprint of switch 54 at least partially overlaps a footprint of PA control circuit 15.

Accordingly, control signal path 11c and radio frequency transmission path 11r are disposed with ground planar electrode 93G interposed therebetween. Accordingly, isolation between control signal path 11c and radio frequency transmission path 11r further improves.

It should be noted that, in radio frequency module 1A according to this working example, it is sufficient that switch 54 and PA control circuit 15 be disposed distributed between principal surface 91a and principal surface 91b of module board 91, and the rest of the circuit components may be disposed on either principal surface 91a or principal surface 91b, and in addition, may be embedded in module board 91.

Furthermore, in radio frequency module 1A according to this working example, a plurality of external-connection terminals 150 are disposed on the principal surface 91b (second principal surface)-side of module board 91. Radio frequency module 1A exchanges electrical signals with the mother board disposed on the z-axis negative direction-side of radio frequency module 1A, via external-connection terminals 150. As illustrated in (b) in FIG. 2A, external-connection terminals 150 may be disposed on the outer edge region of principal surface 91b. Some external-connection terminals 150 are set to the ground potential of the mother board.

According to the above-described arrangement configuration of external-connection terminals 150, several external-connection terminals 150 which are used as ground electrodes are disposed in the surroundings of PA control circuit 15 which generates digital noise and/or power supply noise, and thus it is possible to prevent the digital noise and/or power supply noise from flowing into the other circuit elements.

Furthermore, external-connection terminal 150RF is equivalent to transmission input terminal 111 or 112 in FIG. 1A, and external-connection terminal 150DC is equivalent to control signal terminal 113 in FIG. 1A. External-connection terminal 150RF is connected to switch 54 disposed on principal surface 91a, via a via conductor formed in module board 91. Furthermore, external-connection terminal 150DC is connected to PA control circuit 15 disposed on principal surface 91b, via a line, or the like, formed in principal surface 91b. As illustrated in (b) in FIG. 2A, at least one external-connection terminal 150 that is set to the ground potential is disposed between external-connection terminal 150RF and external-connection terminal 150DC. Accordingly, it is possible to prevent digital control signals and/or power supply signals transferred through external-connection terminal 150DC from flowing into external-connection terminal 150RF as digital noise and/or power supply noise.

Furthermore, in radio frequency module 1A according to this working example, transmission power amplifier 11 is mounted on principal surface 91a (first principal surface).

Among the circuit components included in radio frequency module 1A, transmission power amplifier 11 is a component that generates a large amount of heat. To improve the heat dissipation of radio frequency module 1A, it is important to dissipate the heat generated by transmission power amplifier 11 to the mother board, using a heat dissipation path having a small thermal resistance. If transmission power amplifier 11 were mounted on principal surface 91b, the electrode line connected to transmission power amplifier 11 would be disposed on principal surface 91b. For this reason, the heat dissipation path would include a heat dissipation path that passes through only the planar line pattern (along the xy plane direction) on principal surface 91b. This planar line pattern has a large thermal resistance due to being formed using metal thin-film. For this reason, when transmission power amplifier 11 is disposed on principal surface 91b, heat dissipation deteriorates.

In contrast, when transmission power amplifier 11 is mounted on principal surface 91a, transmission power amplifier 11 and at least one external-connection terminal 150 can be connected via a through electrode penetrating between principal surface 91a and principal surface 91b. Therefore, as a heat dissipation path of transmission power amplifier 11, a heat dissipation path that passes through only the planar line pattern along the xy plane direction and has a large thermal resistance among the lines in module board 91 can be eliminated. Therefore, it is possible to provide radio frequency module 1A which is small and has improved heat dissipation from transmission power amplifier 11 to the mother board.

It should be noted that, from the viewpoint of heat dissipation, it is desirable that the aforementioned through electrode or a heat-dissipating component be disposed in the region of principal surface 91b which is on the opposite side of the region of principal surface 91a in which transmission power amplifier 11 is disposed, and thus it is desirable that circuit elements are not disposed in the aforementioned region of principal surface 91b.

Furthermore, in radio frequency module 1A according to this working example, in a plan view of principal surface 91a, transmission power amplifier 11 and switch 54 are disposed next to each other.

Accordingly, radio frequency transmission path 11r connecting transmission power amplifier 11 and switch 54 can be shortened, and thus transfer loss of transmission signals can be reduced.

Furthermore, in radio frequency module 1A according to this working example, reception low-noise amplifier 21 is disposed on principal surface 91b (second principal surface).

Accordingly, since transmission power amplifier 11 and reception low-noise amplifier 21 are disposed with module board 91 interposed therebetween, the isolation between transmission and reception can be improved.

Furthermore, since transmission power amplifier 11 for which profile reduction is not readily achievable is not disposed on principal surface 91b which faces the mother board, out of principal surfaces 91a and 91b, and reception low-noise amplifier 21 and switches 52 and 53 for which profile reduction is readily achievable are disposed on principal surface 91b, profile reduction of radio frequency module 1A as a whole can be achieved. Furthermore, since several external-connection terminals 150 which are used as ground electrodes are arranged around reception low-noise amplifier 21 which has a big impact on the reception sensitivity of the reception circuit, deterioration of reception sensitivity of the reception circuit can be suppressed.

Furthermore, as illustrated in FIG. 2A and FIG. 2B, reception low-noise amplifier 21 and switches 52 and 53 may be included in one semiconductor IC 20. Accordingly, the z-axis direction height on the principal surface 91b-side can be reduced, and the component mounting area of principal surface 91b can be reduced. Therefore, radio frequency module 1A can be miniaturized. In addition, semiconductor IC 20 may include switch 51.

It should be noted that external-connection terminals 150 may be columnar electrodes penetrating through resin material 93 in the z-axis direction as illustrated in FIG. 2A and FIG. 2B, and may be bump electrodes 160 formed on principal surface 91b as illustrated in FIG. 2C. As illustrated in FIG. 2C, when external-connection terminals 150 are bump electrodes 160, resin material 93 is not disposed on principal surface 91b.

Furthermore, external-connection terminals 150 may be disposed on principal surface 91a.

[5. Circuit Element Arrangement Configuration of Radio Frequency Module 1D According to Working Example 3]

Figure 3A:
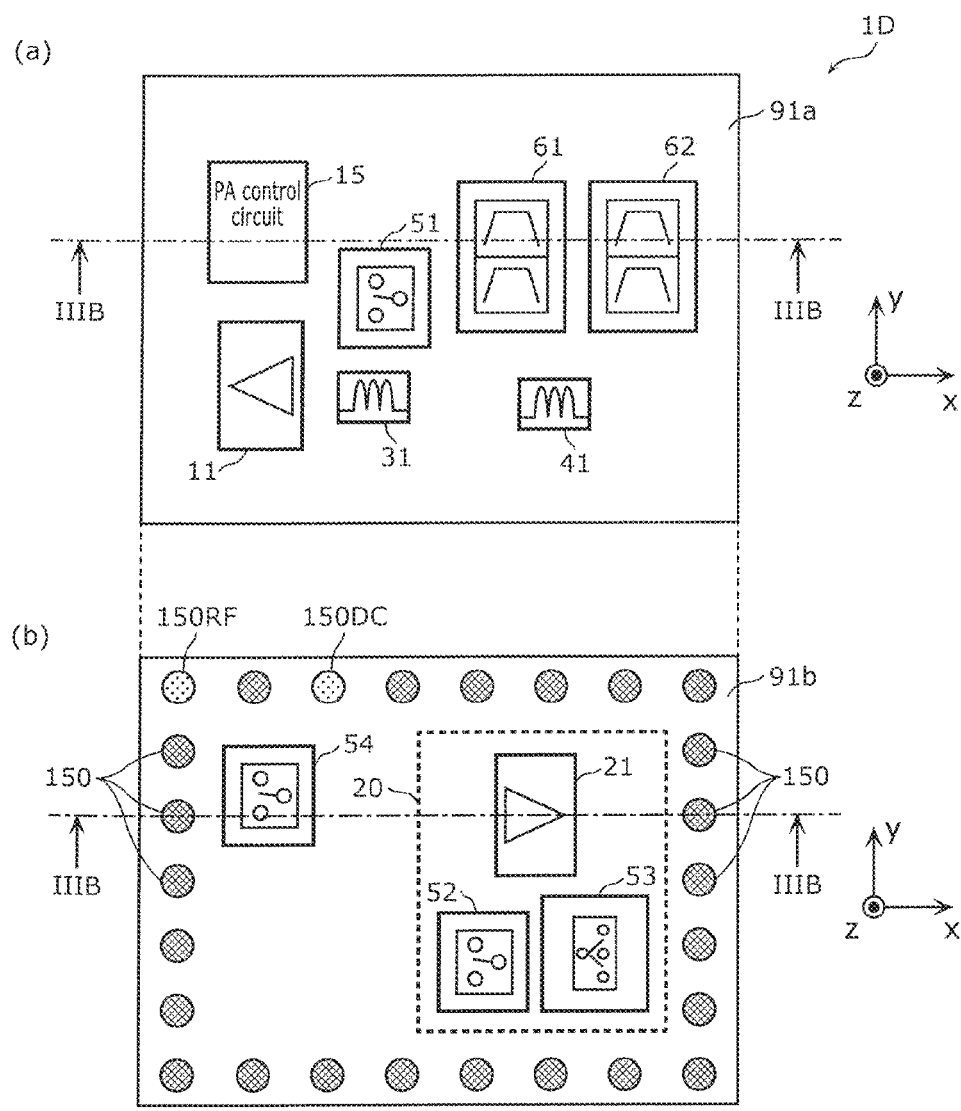
FIG. 3A is a schematic diagram illustrating a plan view configuration of a radio frequency module according to Working Example 3.
Figure 3B:
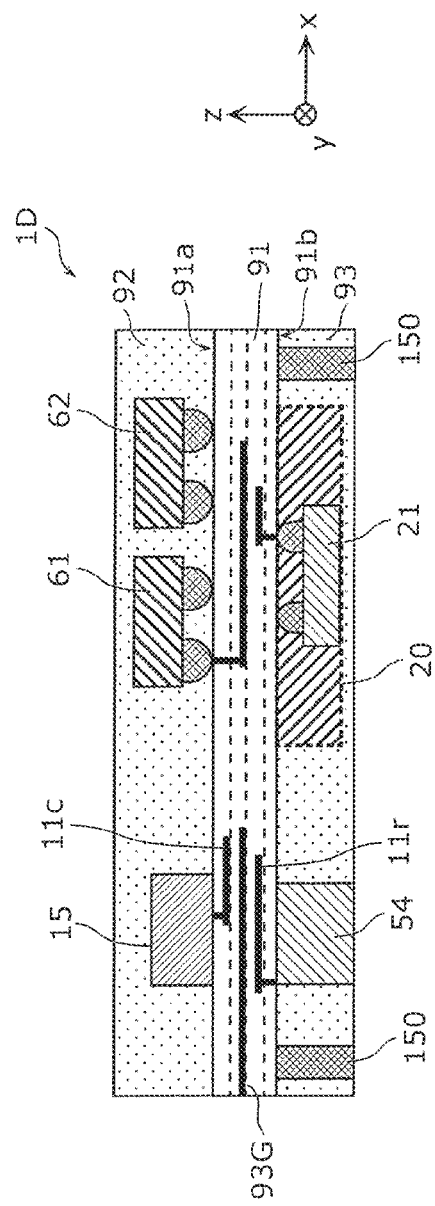
FIG. 3B is a schematic diagram illustrating a cross-sectional configuration of the radio frequency module according to Working Example 3.

FIG. 3A is a schematic diagram illustrating a plan view configuration of radio frequency module 1D according to Working Example 3. Furthermore, FIG. 3B is a schematic diagram illustrating a cross-sectional configuration of radio frequency module 1D according to Working Example 3, and specifically illustrates a cross-section taken along line IIIB-IIIB in FIG. 3A. It should be noted that (a) in FIG. 3A illustrates an arrangement diagram of circuit elements in the case where principal surface 91a of opposite principal surfaces 91a and 91b of module board 91 is viewed from the z-axis positive direction-side. On the other hand, (b) in FIG. 3A illustrates a see-through view of the arrangement of circuit elements in the case where principal surface 91b is viewed from the z-axis positive direction-side.

Radio frequency module 1D according to Working Example 3 shows a specific arrangement configuration of respective circuit elements included in radio frequency module 1A according to the embodiment illustrated in FIG. 1A.

Compared to radio frequency module 1A according to Working Example 1, radio frequency module 1D according to this working example is different only in the arrangement configuration of switch 54 and PA control circuit 15. Hereinafter, radio frequency module 1D according to this working example will be described, omitting description of points that are the same as in radio frequency module 1A according to Working Example 1 and focusing on the points that are different.

Module board 91 includes principal surface 91a (second principal surface) and principal surface 91b (first principal surface) on opposite sides, and is a board on which the transmission circuits and the reception circuits are mounted. For module board 91, for example, an LTCC board having a stacked structure of a plurality of dielectric layers, an HTCC board, a component-embedded board, a board having an RDL, a printed circuit board, or the like can be used.

As illustrated in FIG. 3A and FIG. 3B, in radio frequency module 1D according to this working example, transmission power amplifier 11, PA control circuit 15, switch 51, duplexers 61 and 62, and matching circuits 31 and 41 are surface mounted on principal surface 91a of module board 91. On the other hand, reception low-noise amplifier 21 and switches 52, 53, and 54 are surface mounted on principal surface 91b of module board 91.

In this working example, switch 54 is mounted on principal surface 91b (first principal surface). On the other hand, PA control circuit 15 is mounted on principal surface 91a (second principal surface). In other words, PA control circuit 15 and switch 54 are disposed with module board 91 interposed therebetween. Accordingly, as illustrated in FIG. 3B, radio frequency transmission path 11r connecting transmission power amplifier 11 and switch 54 and control signal path 11c connecting transmission power amplifier 11 and PA control circuit 15 can be formed distributed between the principal surface 91b-side of module board 91 and the principal surface 91a-side of module board 91, respectively. Accordingly, since isolation between control signal path 11c and radio frequency transmission path 11r can be ensured, it is possible to prevent digital control signals and/or power supply signals output from PA control circuit 15 and transferred through control signal path 11c from flowing into radio frequency transmission path 11r on the input side of transmission power amplifier 11 as digital noise and/or power supply noise. Therefore, it is possible to suppress deterioration of quality of radio frequency transmission signals amplified by transmission power amplifier 11.

It should be noted that, as illustrated in FIG. 3B, it is desirable that module board 91 include ground planar electrode 93G formed between principal surface 91a and principal surface 91b. Here, it is desirable that, in a plan view of module board 91, a footprint of ground planar electrode 93G at least partially overlaps a footprint of switch 54, and a footprint of ground planar electrode 93G at least partially overlaps a footprint of PA control circuit 15.

Accordingly, the isolation between control signal path 11c and radio frequency transmission path 11r is further improved by the electromagnetic field blocking function of ground planar electrode 93G. Therefore, it is possible to further suppress deterioration of quality of radio frequency transmission signals amplified by transmission power amplifier 11.

In addition, it is desirable that, in a plan view of module board 91, a footprint of switch 54 at least partially overlaps a footprint of PA control circuit 15.

Accordingly, control signal path 11c and radio frequency transmission path 11r are disposed with ground planar electrode 93G interposed therebetween. Accordingly, isolation between control signal path 11c and radio frequency transmission path 11r further improves.

It should be noted that, in radio frequency module 1D according to this working example, it is sufficient that switch 54 and PA control circuit 15 be disposed distributed between principal surface 91a and principal surface 91b of module board 91, and the rest of the circuit components may be disposed on either principal surface 91a or principal surface 91b, and in addition, may be embedded in module board 91.

Furthermore, in radio frequency module 1D according to this working example, a plurality of external-connection terminals 150 are disposed on the principal surface 91b (first principal surface)-side of module board 91. Radio frequency module 1D exchanges electrical signals with the mother board disposed on the z-axis negative direction-side of radio frequency module 1D, via external-connection terminals 150. Some external-connection terminals 150 are set to the ground potential of the mother board. Furthermore, external-connection terminal 150RF is equivalent to transmission input terminal 111 or 112 in FIG. 1A, and external-connection terminal 150DC is equivalent to control signal terminal 113 in FIG. 1A. External-connection terminal 150DC is connected to PA control circuit 15 disposed on principal surface 91a, via a via conductor formed in module board 91. Furthermore, external-connection terminal 150RF is connected to switch 54 disposed on principal surface 91b, via a line, or the like, formed in principal surface 91b. As illustrated in (b) in FIG. 3A, at least one external-connection terminal 150 that is set to the ground potential is disposed between external-connection terminal 150RF and external-connection terminal 150DC. Accordingly, it is possible to prevent digital control signals and/or power supply signals transferred through external-connection terminal 150DC from flowing into external-connection terminal 150RF as digital noise and/or power supply noise.

Furthermore, in radio frequency module 1D according to this working example, transmission power amplifier 11 is mounted on principal surface 91a (second principal surface). When transmission power amplifier 11 is mounted on principal surface 91a, transmission power amplifier 11 and at least one external-connection terminal 150 can be connected via a through electrode penetrating between principal surface 91a and principal surface 91b. Therefore, as a heat dissipation path of transmission power amplifier 11, a heat dissipation path that passes through only the planar line pattern along the xy plane direction and has a large thermal resistance among the lines in module board 91 can be eliminated. Therefore, it is possible to provide radio frequency module 1D which is small and has improved heat dissipation from transmission power amplifier 11 to the mother board.

It should be noted that, from the viewpoint of heat dissipation, it is desirable that the aforementioned through electrode or a heat-dissipating component be disposed in the region of principal surface 91b which is on the opposite side of the region of principal surface 91a in which transmission power amplifier 11 is disposed, and thus it is desirable that circuit elements are not disposed in the aforementioned region of principal surface 91b.

Furthermore, in radio frequency module 1D according to this working example, in a plan view of principal surface 91a, transmission power amplifier 11 and PA control circuit 15 are disposed next to each other.

Accordingly, control signal path 11c connecting transmission power amplifier 11 and PA control circuit 15 can be shortened, and thus generation of digital noise and/or power supply noise can be suppressed.

Furthermore, in radio frequency module 1D according to this working example, reception low-noise amplifier 21 is disposed on principal surface 91b (first principal surface).

Accordingly, since transmission power amplifier 11 and reception low-noise amplifier 21 are disposed with module board 91 interposed therebetween, the isolation between transmission and reception can be improved.

Furthermore, since transmission power amplifier 11 for which profile reduction is not readily achievable is not disposed on principal surface 91b which faces the mother board, out of principal surfaces 91a and 91b, and reception low-noise amplifier 21 and switches 52, 53, and 54 for which profile reduction is readily achievable are disposed on principal surface 91b, profile reduction of radio frequency module 1D as a whole can be achieved. Furthermore, since several external-connection terminals 150 which are used as ground electrodes are arranged around reception low-noise amplifier 21 which has a big impact on the reception sensitivity of the reception circuit, deterioration of reception sensitivity of the reception circuit can be suppressed.

Furthermore, as illustrated in FIG. 3A and FIG. 3B, reception low-noise amplifier 21 and switches 52 and 53 may be included in one semiconductor IC 20. Accordingly, the z-axis direction height on the principal surface 91b-side can be reduced, and the component mounting area of principal surface 91b can be reduced. Therefore, radio frequency module 1D can be miniaturized. In addition, semiconductor IC 20 may include switch 54.

Furthermore, external-connection terminals 150 may be disposed on principal surface 91a.

[6. Circuit Element Arrangement Configuration of Radio Frequency Module 1E According to Working Example 4]

Figure 4:
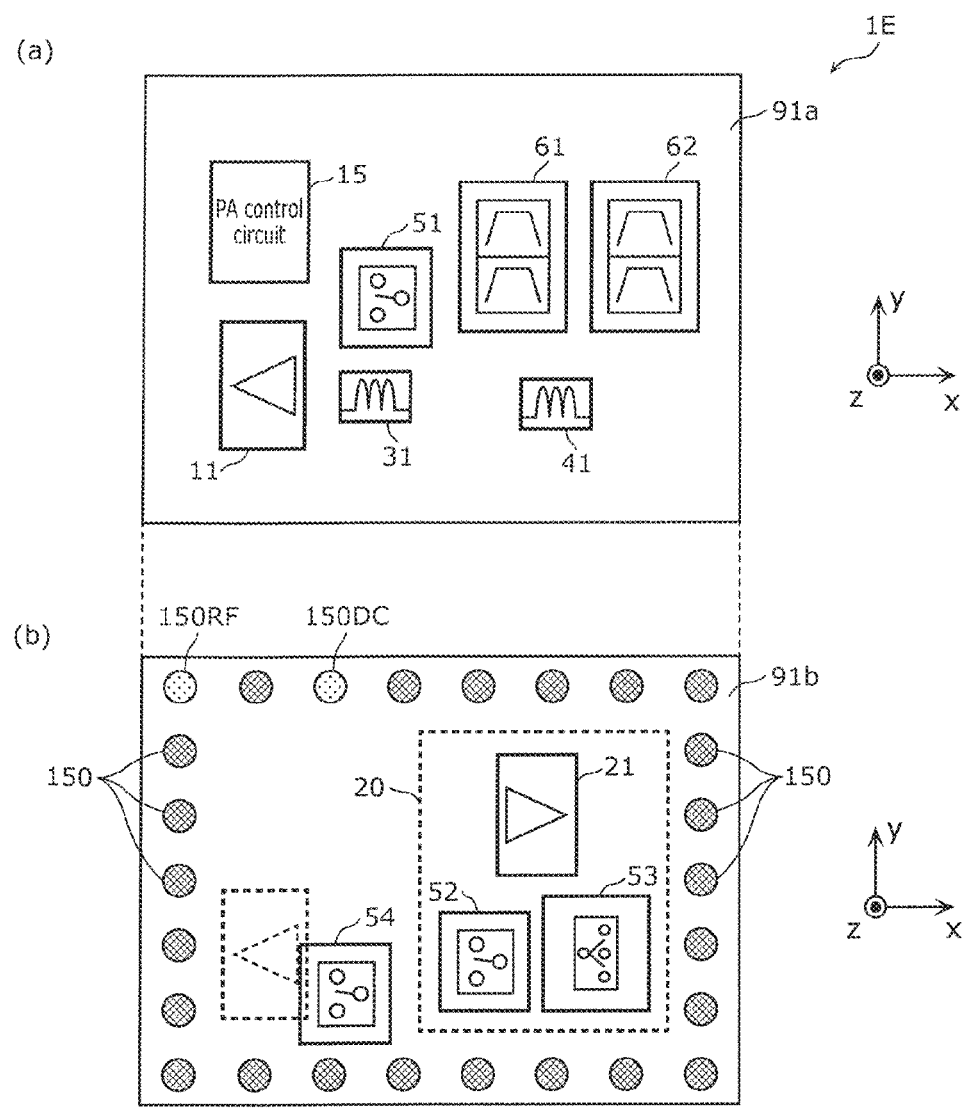
FIG. 4 is a schematic diagram illustrating a plan view configuration of a radio frequency module according to Working Example 4.

FIG. 4 is a schematic diagram illustrating a plan view configuration of radio frequency module 1E according to Working Example 4. It should be noted that (a) in FIG. 4 illustrates an arrangement diagram of circuit elements in the case where principal surface 91a of opposite principal surfaces 91a and 91b of module board 91 is viewed from the z-axis positive direction-side. On the other hand, (b) in FIG. 4 illustrates a see-through view of the arrangement of circuit elements in the case where principal surface 91b is viewed from the z-axis positive direction-side.

Radio frequency module 1E according to Working Example 4 shows a specific arrangement configuration of respective circuit elements included in radio frequency module 1A according to the embodiment illustrated in FIG. 1A.

Compared to radio frequency module 1D according to Working Example 3, radio frequency module 1E according to this working example is different in the arrangement configuration of switch 54. Hereinafter, radio frequency module 1E according to this working example will be described, omitting description of points that are the same as in radio frequency module 1D according to Working Example 3 and focusing on the points that are different.

Module board 91 includes principal surface 91a (second principal surface) and principal surface 91b (first principal surface) on opposite sides, and is a board on which the above-described transmission circuits and reception circuits are mounted.

As illustrated in FIG. 4, in radio frequency module 1E according to this working example, transmission power amplifier 11, PA control circuit 15, switch 51, duplexers 61 and 62, and matching circuits 31 and 41 are surface mounted on principal surface 91a of module board 91. On the other hand, reception low-noise amplifier 21 and switches 52, 53, and 54 are surface mounted on principal surface 91b of module board 91.

In this working example, switch 54 is mounted on principal surface 91b. On the other hand, PA control circuit 15 is mounted on principal surface 91a. In other words, PA control circuit 15 and switch 54 are disposed with module board 91 interposed therebetween. Accordingly, radio frequency transmission path 11r and control signal path 11c can be formed distributed between the principal surface 91b-side of module board 91 and the principal surface 91a-side of module board 91, respectively. Accordingly, since isolation between control signal path 11c and radio frequency transmission path 11r can be ensured, it is possible to prevent digital control signals and/or power supply signals output from PA control circuit 15 and transferred through control signal path 11c from flowing into radio frequency transmission path 11r on the input side of transmission power amplifier 11 as digital noise and/or power supply noise. Therefore, it is possible to suppress deterioration of quality of radio frequency transmission signals amplified by transmission power amplifier 11.

Furthermore, in radio frequency module 1E according to this working example, in a plan view of module board 91, a footprint of transmission power amplifier 11 at least partially overlaps with a footprint of switch 54. It should be noted that (b) in FIG. 4 illustrates the projected position in principal surface 91b (indicated by broken line) of transmission power amplifier 11 disposed on principal surface 91a.

Accordingly, transmission power amplifier 11 and switch 54 can be connected via a via conductor formed in a direction (z-axis direction) perpendicular to principal surfaces 91a and 91b in module board 91. Therefore, the line connecting transmission power amplifier 11 and switch 54 can be shortened, and thus transfer loss of transmission signals of communication bands A and B can be reduced.

Furthermore, in radio frequency module 1E according to this working example, in a plan view of module board 91, a footprint of PA control circuit 15 does not overlap with a footprint of switch 54.

Accordingly, aside from control signal path 11c and radio frequency transmission path 11r being disposed distributed on opposite sides of module board 91, a large distance can be maintained between control signal path 11c and radio frequency transmission path 11r in the aforementioned plan view, and thus isolation between control signal path 11c and radio frequency transmission path 11r can be improved.

Furthermore, external-connection terminals 150 may be disposed on principal surface 91a.

[7. Circuit Element Arrangement Configuration of Radio Frequency Module 1B According to Working Example 5]

Figure 5:
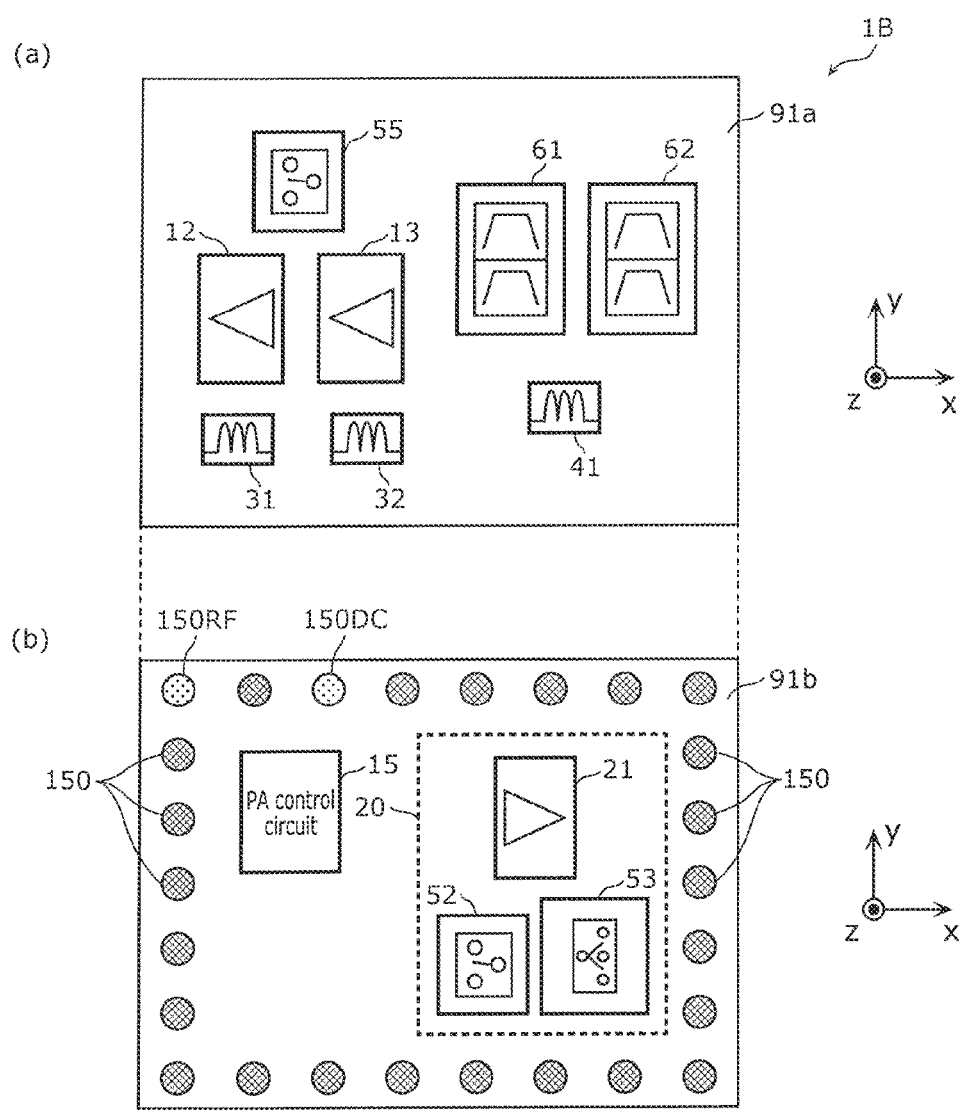
FIG. 5 is a schematic diagram illustrating a plan view configuration of a radio frequency module according to Working Example 5.

FIG. 5 is a schematic diagram illustrating a plan view configuration of radio frequency module 1B according to Working Example 5. It should be noted that (a) in FIG. 5 illustrates an arrangement diagram of circuit elements in the case where principal surface 91a of opposite principal surfaces 91a and 91b of module board 91 is viewed from the z-axis positive direction-side. On the other hand, (b) in FIG. 5 illustrates a see-through view of the arrangement of circuit elements in the case where principal surface 91b is viewed from the z-axis positive direction-side.

Radio frequency module 1B according to Working Example 5 shows a specific arrangement configuration of respective circuit elements included in radio frequency module 1B according to the variation of the embodiment illustrated in FIG. 1B.

Compared to radio frequency module 1A according to Working Example 1, radio frequency module 1B according to this working example is different in that two transmission power amplifiers 12 and 13 and two matching circuits 31 and 32 are mounted on module board 91. Hereinafter, radio frequency module 1B according to this working example will be described, omitting description of points that are the same as in radio frequency module 1A according to Working Example 1 and focusing on the points that are different.

Module board 91 includes principal surface 91a (first principal surface) and principal surface 91b (second principal surface) on opposite sides, and is a board on which the above-described transmission circuits and reception circuits are mounted. For module board 91, for example, an LTCC board having a stacked structure of a plurality of dielectric layers, an HTCC board, a component-embedded board, a board having an RDL, a printed circuit board, or the like can be used.

As illustrated in FIG. 5, in radio frequency module 1B according to this working example, transmission power amplifiers 12 and 13, switch 55, duplexers 61 and 62, and matching circuits 31, 32, and 41 are surface mounted on principal surface 91a of module board 91. On the other hand, PA control circuit 15, reception low-noise amplifier 21, and switches 52 and 53 are surface mounted on principal surface 91b of module board 91.

In this working example, switch 55 is mounted on principal surface 91a. On the other hand, PA control circuit 15 is mounted on principal surface 91b. In other words, PA control circuit 15 and switch 55 are disposed with module board 91 interposed therebetween. Accordingly, radio frequency transmission path 12r connecting transmission power amplifier 12 and switch 55 and control signal path 12c connecting transmission power amplifier 12 and PA control circuit 15 can be formed distributed between the principal surface 91a-side of module board 91 and principal surface 91b-side of module board 91, respectively. Accordingly, since isolation between control signal path 12c and radio frequency transmission path 12r can be ensured, it is possible to prevent digital control signals and/or power supply signals output from PA control circuit 15 and transferred through control signal path 12c from flowing into radio frequency transmission path 12r on the input side of transmission power amplifier 12 as digital noise and/or power supply noise. Therefore, it is possible to suppress deterioration of quality of radio frequency transmission signals of communication band A amplified by transmission power amplifier 12. Furthermore, radio frequency transmission path 13r connecting transmission power amplifier 13 and switch 55 and control signal path 13c connecting transmission power amplifier 13 and PA control circuit 15 can be formed distributed between the principal surface 91a-side of module board 91 and principal surface 91b-side of module board 91, respectively. Accordingly, since isolation between control signal path 13c and radio frequency transmission path 13r can be ensured, it is possible to prevent digital control signals and/or power supply signals output from PA control circuit 15 and transferred through control signal path 13c from flowing into radio frequency transmission path 13r on the input side of transmission power amplifier 13 as digital noise and/or power supply noise. Therefore, it is possible to suppress deterioration of quality of radio frequency transmission signals of communication band B amplified by transmission power amplifier 13.

It should be noted that it is desirable that module board 91 include ground planar electrode 93G formed between principal surface 91a and principal surface 91b. Here, it is desirable that, in a plan view of module board 91, a footprint of ground planar electrode 93G at least partially overlaps a footprint of switch 55, and a footprint of ground planar electrode 93G at least partially overlaps with a footprint of PA control circuit 15.

Accordingly, the isolation between control signal path 12c and radio frequency transmission path 12r and the isolation between control signal path 13c and radio frequency transmission path 13r are further improved by the electromagnetic field blocking function of ground planar electrode 93G. Therefore, it is possible to further suppress deterioration of quality of radio frequency transmission signals of communication band A amplified by transmission power amplifier 12 and radio frequency transmission signals of communication band B amplified by transmission power amplifier 13.

In addition, it is desirable that, in a plan view of module board 91, a footprint of switch 55 at least partially overlaps a footprint of PA control circuit 15.

Accordingly, control signal path 12c and radio frequency transmission path 12r are disposed with ground planar electrode 93G interposed therebetween. Accordingly, control signal path 13c and radio frequency transmission path 13r are disposed with ground planar electrode 93G interposed therebetween. Accordingly, isolation between control signal path 12c and radio frequency transmission path 12r and isolation between control signal path 13c and radio frequency transmission path 13r further improves.

It should be noted that, in radio frequency module 1B according to this working example, it is sufficient that switch 55 and PA control circuit 15 be disposed distributed between principal surface 91a and principal surface 91b of module board 91, and the rest of the circuit components may be disposed on either principal surface 91a or principal surface 91b, and in addition, may be embedded in module board 91.

Furthermore, in radio frequency module 1B according to this working example, a plurality of external-connection terminals 150 are disposed on the principal surface 91b (second principal surface)-side of module board 91. Radio frequency module 1B exchanges electrical signals with the mother board disposed on the z-axis negative direction-side of radio frequency module 1B, via external-connection terminals 150. As illustrated in (b) in FIG. 5, external-connection terminals 150 may be disposed on the outer edge region of principal surface 91b. Some external-connection terminals 150 are set to the ground potential of the mother board. Furthermore, external-connection terminal 150RF is equivalent to transmission input terminal 110 in FIG. 1B, and external-connection terminal 150DC is equivalent to control signal terminal 113 or 114 in FIG. 1B. External-connection terminal 150RF is connected to switch 55 disposed on principal surface 91a, via a via conductor formed in module board 91. Furthermore, external-connection terminal 150DC is connected to PA control circuit 15 disposed on principal surface 91b, via a line, or the like, formed in principal surface 91b. As illustrated in (b) in FIG. 5, at least one external-connection terminal 150 set to the ground potential is disposed between external-connection terminal 150RF and external-connection terminal 150DC. Accordingly, it is possible to prevent digital control signals and/or power supply signals transferred through external-connection terminal 150DC from flowing into external-connection terminal 150RF as digital noise and/or power supply noise.

According to the above-described arrangement configuration of external-connection terminals 150, several external-connection terminals 150 which are used as ground electrodes are disposed in the surroundings of PA control circuit 15 which generates digital noise and/or power supply noise, and thus it is possible to prevent the digital noise and/or power supply noise from flowing into the other circuit elements.

Furthermore, in radio frequency module 1B according to this working example, transmission power amplifiers 12 and 13 are mounted on principal surface 91a (first principal surface). When transmission power amplifiers 12 and 13 are disposed on principal surface 91a, transmission power amplifier 12 or 13 and at least one external-connection terminal 150 can be connected via a through electrode penetrating between principal surface 91a and principal surface 91b. Therefore, as heat dissipation paths of transmission power amplifiers 12 and 13, a heat dissipation path that passes through only the planar line pattern along the xy plane direction and has a large thermal resistance among the lines in module board 91 can be eliminated. Therefore, it is possible to provide radio frequency module 1B which is small and has improved heat dissipation from transmission power amplifiers 12 and 13 to the mother board.

Furthermore, in radio frequency module 1B according to this working example, in a plan view of principal surface 91a, transmission power amplifiers 12 and 13 and switch 55 are disposed next to each other.

Accordingly, radio frequency transmission path 12r connecting transmission power amplifier 12 and switch 55 and radio frequency transmission path 13r connecting transmission power amplifier 13 and switch 55 can be shortened, and thus transfer loss of transmission signals of communication bands A and B can be reduced.

Furthermore, in radio frequency module 1B according to this working example, reception low-noise amplifier 21 is disposed on principal surface 91b (second principal surface).

Accordingly, since transmission power amplifiers 12 and 13 and reception low-noise amplifier 21 are disposed with module board 91 interposed therebetween, the isolation between transmission and reception can be improved.

Furthermore, external-connection terminals 150 may be disposed on principal surface 91a.

[8. Advantageous Effects, and So On]

As described above, radio frequency module 1A according to this embodiment includes module board 91 including principal surfaces 91a and 91b on opposite sides, transmission input terminals 111 and 112, transmission power amplifier 11 that amplifies transmission signals input from transmission input terminals 111 and 112, switch 54 that switches connection and disconnection between transmission input terminals 111 and 112 and transmission power amplifier 11, and PA control circuit 15 that controls transmission power amplifier 11 using digital control signals. Here, switch 54 is disposed on principal surface 91a, and PA control circuit 15 is disposed on principal surface 91b.

Accordingly, PA control circuit 15 and switch 54 are disposed with module board 91 interposed therebetween. Accordingly, radio frequency transmission path 11r connecting transmission power amplifier 11 and switch 54 and control signal path 11c connecting transmission power amplifier 11 and PA control circuit 15 can be formed distributed between the principal surface 91a-side of module board 91 and principal surface 91b-side of module board 91, respectively. Accordingly, since isolation between control signal path 11c and radio frequency transmission path 11r can be ensured, it is possible to prevent digital control signals and/or power supply signals output from PA control circuit 15 and transferred through control signal path 11c from flowing into radio frequency transmission path 11r on the input side of transmission power amplifier 11 as digital noise and/or power supply noise. Therefore, it is possible to suppress deterioration of quality of radio frequency transmission signals amplified by transmission power amplifier 11.

Furthermore, module board 91 may include ground planar electrode 93G formed between principal surface 91a and principal surface 91b and, in a plan view of module board 91, a footprint of ground planar electrode 93G at least partially overlaps with a footprint of switch 54, and a footprint of ground planar electrode 93G at least partially overlaps with a footprint of PA control circuit 15.

Accordingly, the isolation between control signal path 11c and radio frequency transmission path 11r is further improved by the electromagnetic field blocking function of ground planar electrode 93G. Therefore, it is possible to further suppress deterioration of quality of radio frequency transmission signals amplified by transmission power amplifier 11.

Furthermore, in radio frequency module 1A, in a plan view of module board 91, a footprint of switch 54 at least partially overlaps a footprint of PA control circuit 15.

Accordingly, control signal path 11c and radio frequency transmission path 11r are disposed with ground planar electrode 93G interposed therebetween. Accordingly, isolation between control signal path 11c and radio frequency transmission path 11r further improves.

Furthermore, radio frequency module 1A may further include external-connection terminals 150, and external-connection terminals 150 may be disposed on principal surface 91b.

Accordingly, since several external-connection terminals 150 which are used as ground electrodes are disposed in the surroundings of PA control circuit 15 which generates digital noise and/or power supply noise, it is possible to prevent the digital noise and/or power supply noise from flowing into the other circuit elements.

Furthermore, in radio frequency module 1A, transmission power amplifier 11 may be disposed on principal surface 91a.

Accordingly, when transmission power amplifier 11 is mounted on principal surface 91a, transmission power amplifier 11 and at least one external-connection terminal 150 can be connected via a through electrode penetrating between principal surface 91a and principal surface 91b. Therefore, as a heat dissipation path of transmission power amplifier 11, a heat dissipation path that passes through only the planar line pattern along the xy plane direction and has a large thermal resistance among the lines in module board 91 can be eliminated. Therefore, it is possible to provide radio frequency module 1A which is small and has improved heat dissipation from transmission power amplifier 11 to the mother board.

Furthermore, in radio frequency module 1A, in a plan view of principal surface 91a, transmission power amplifier 11 and switch 54 may be disposed next to each other.

Accordingly, radio frequency transmission path 11r connecting transmission power amplifier 11 and switch 54 can be shortened, and thus transmission signal transfer loss can be reduced.

Furthermore, radio frequency module 1D includes module board 91 including principal surface 91a and principal surface 91b on opposite sides, transmission input terminals 111 and 112, transmission power amplifier 11 that amplifies transmission signals input from transmission input terminals 111 and 112, switch 54 that switches connection and disconnection between transmission input terminals 111 and 112 and transmission power amplifier 11, and PA control circuit 15 that controls transmission power amplifier 11 using digital control signals. Here, switch 54 is disposed on principal surface 91b, PA control circuit 15 is disposed on principal surface 91a, and external-connection terminals 150 are disposed on principal surface 91b.

According to this configuration, PA control circuit 15 and switch 54 are disposed with module board 91 interposed therebetween. Accordingly, since isolation between control signal path 11c and radio frequency transmission path 11r can be ensured, it is possible to prevent digital control signals and/or power supply signals output from PA control circuit 15 and transferred through control signal path 11c from flowing into radio frequency transmission path 11r on the input side of transmission power amplifier 11 as digital noise and/or power supply noise. Therefore, it is possible to suppress deterioration of quality of radio frequency transmission signals amplified by transmission power amplifier 11.

Furthermore, in radio frequency module 1D, transmission power amplifier 11 may be disposed on principal surface 91a.

Accordingly, it is possible to provide radio frequency module 1D which is small and has improved heat dissipation from transmission power amplifier 11 to the mother board.

Furthermore, in radio frequency module 1D, in a plan view of principal surface 91a, transmission power amplifier 11 and PA control circuit 15 may be disposed next to each other.

Accordingly, control signal path 11c connecting transmission power amplifier 11 and PA control circuit 15 can be shortened, and thus generation of digital noise and/or power supply noise can be suppressed.

Furthermore, in radio frequency module 1E, in a plan view of module board 91, a footprint of transmission power amplifier 11 at least partially overlaps with a footprint of switch 54.

Accordingly, transmission power amplifier 11 and switch 54 can be connected via a via conductor formed in a direction (z-axis direction) perpendicular to principal surfaces 91a and 91b in module board 91. Therefore, the line connecting transmission power amplifier 11 and switch 54 can be shortened, and thus transmission signal transfer loss can be reduced.

Furthermore, radio frequency modules 1A, 1D, and 1E may further include reception low-noise amplifier 21 that amplifies reception signals, and reception low-noise amplifier 21 may be disposed on principal surface 91b.

Accordingly, since transmission power amplifier 11 and reception low-noise amplifier 21 are disposed with module board 91 interposed therebetween, the isolation between transmission and reception can be improved.

Furthermore, in radio frequency modules 1D and 1E, transmission power amplifier 11 for which profile reduction is not readily achievable is not disposed on principal surface 91b and reception low-noise amplifier 21 and switches 52, 53, and 54 for which profile reduction is readily achievable are disposed on principal surface 91b, and thus profile reduction of the radio frequency module as a whole can be achieved. Furthermore, since several external-connection terminals 150 which are used as ground electrodes are arranged around reception low-noise amplifier 21 which has a big impact on the reception sensitivity of the reception circuit, deterioration of reception sensitivity of the reception circuit can be suppressed.

Furthermore, in radio frequency modules 1D and 1E, switch 54 and reception low-noise amplifier 21 may be included in one semiconductor IC 20.

Accordingly, the z-axis direction height on the principal surface 91b-side can be reduced, and the component mounting area of principal surface 91b can be reduced. Therefore, the radio frequency module can be miniaturized.

Furthermore, communication device 5A includes antenna 2, RFIC 3 that processes a radio frequency signal which is to be transmitted or has been received by antenna 2, and radio frequency circuit 1A that transfers the radio frequency signal between antenna 2 and RFIC 3.

Accordingly, it is possible to suppress deterioration of quality of radio frequency transmission signals amplified by transmission power amplifier 11.

(Other Embodiments)

Although a radio frequency module and a communication device according to the present disclosure have been described above based on an exemplary embodiment and a variation and working examples thereof, the radio frequency circuit and the communication device according to the present disclosure are not limited to the foregoing embodiment, variation, and working examples. The present disclosure also encompasses other embodiments achieved by combining arbitrary elements in the above embodiment and variation and working examples thereof, variations resulting from various modifications to the embodiment and the variation and working examples thereof that may be conceived by those skilled in the art without departing from the essence of the present disclosure, and various devices that include the radio frequency module and communication device described above.

For example, in the radio frequency module and communication device according to the foregoing embodiment and the variation and working examples thereof, another circuit element and line may be inserted in a path connecting respective circuit elements and signal paths disclosed in the drawings.

INDUSTRIAL APPLICABILITY

The present disclosure can be widely used in communication apparatuses such as a mobile phone, as a radio frequency module provided in a multiband-compatible front-end unit.

The invention claimed is:

1. A radio frequency module, comprising:
a module board including a first principal surface and a second principal surface on opposite sides of the module board;
a transmission input terminal;
a transmission power amplifier configured to amplify a transmission signal input from the transmission input terminal;
a switch disposed on the first principal surface and configured to switch between connecting and disconnecting the transmission input terminal and the transmission power amplifier; and
a control circuit disposed on the second principal surface and configured to control the transmission power amplifier using a digital control signal.

2. The radio frequency module of claim 1, wherein the module board includes a ground planar electrode disposed between the first principal surface and the second principal surface.

3. The radio frequency module of claim 2, wherein in a plan view of the module board, a footprint of the ground planar electrode at least partially overlaps a footprint of the switch.

4. The radio frequency module of claim 2, wherein in a plan view of the module board, a footprint of the ground planar electrode at least partially overlaps a footprint of the control circuit.

5. The radio frequency module of claim 1, wherein in a plan view of the module board, a footprint of the switch at least partially overlaps a footprint of the control circuit.

6. The radio frequency module of claim 1, further comprising:
one or more external-connection terminals disposed on the second principal surface.

7. The radio frequency module of claim 6, wherein the transmission power amplifier is disposed on the first principal surface.

8. The radio frequency module of claim 7, wherein in a plan view of the first principal surface, the transmission power amplifier and the switch are disposed next to each other.

9. The radio frequency module of claim 1, further comprising:
one or more external-connection terminals disposed on the first principal surface.

10. The radio frequency module of claim 9, wherein the transmission power amplifier is disposed on the second principal surface.

11. The radio frequency module of claim 10, wherein in a plan view of the second principal surface, the transmission power amplifier and the control circuit are disposed next to each other.

12. The radio frequency module of claim 11, wherein in a plan view of the module board, a footprint of the transmission power amplifier at least partially overlaps a footprint of the switch.

13. The radio frequency module of claim 9, further comprising:

a reception low-noise amplifier disposed on the first principal surface and configured to amplify a reception signal.

14. The radio frequency module of claim 13, wherein the switch and the reception low-noise amplifier are included in a single semiconductor integrated circuit (IC).

15. A communication device, comprising:
an antenna
an RF signal processing circuit configured to process a radio frequency signal which is to be transmitted or has been received by the antenna; and
a radio frequency module configured to transfer the radio frequency signal between the antenna and the RF signal processing circuit, wherein
the radio frequency module comprises:
  a module board including a first principal surface and a second principal surface on opposite sides of the module board;
  a transmission input terminal;
  a transmission power amplifier configured to amplify a transmission signal input from the transmission input terminal;
  a switch disposed on the first principal surface and configured to switch between connecting and disconnecting the transmission input terminal and the transmission power amplifier; and
  a control circuit disposed on the second principal surface and configured to control the transmission power amplifier using a digital control signal.

16. A radio frequency module, comprising:
a module board including a first principal surface and a second principal surface on opposite sides of the module board;
a transmission input terminal;
means for amplifying a transmission signal input from the transmission input terminal;
means, disposed on the first principal surface, for switching between connecting and disconnecting the transmission input terminal and the means for amplifying; and
means, disposed on the second principal surface, for controlling the means for amplifying using a digital control signal.

17. The radio frequency module of claim 16, wherein
the module board includes a ground planar electrode disposed between the first principal surface and the second principal surface, and
in a plan view of the module board,
  a footprint of the ground planar electrode at least partially overlaps a footprint of the switch, and
  a footprint of the ground planar electrode at least partially overlaps a footprint of the control circuit.

18. The radio frequency module of claim 16, further comprising:
one or more external-connection terminals disposed on the second principal surface, wherein
the means for amplifying is disposed on the first principal surface, and
in a plan view of the first principal surface, the transmission power amplifier and the switch are disposed next to each other.

19. The radio frequency module of claim 16, further comprising:
one or more external-connection terminals disposed on the second principal surface, wherein
the transmission power amplifier is disposed on the first principal surface, and
in a plan view of the first principal surface, the transmission power amplifier and the switch are disposed next to each other.

20. The radio frequency module of claim 16, wherein
in a plan view of the module board, a footprint of the transmission power amplifier at least partially overlaps a footprint of the switch,
the radio frequency module further comprises a reception low-noise amplifier disposed on the first principal surface and configured to amplify a reception signal, and
the switch and the reception low-noise amplifier are included in a single semiconductor integrated circuit (IC).

* * * * *